(12) United States Patent
Horesh et al.

(10) Patent No.: US 11,080,359 B2
(45) Date of Patent: Aug. 3, 2021

(54) STABLE DATA-DRIVEN DISCOVERY OF A SYMBOLIC EXPRESSION

(71) Applicant: International Business Machines Corporation, Armonk, NY (US)

(72) Inventors: Lior Horesh, North Salem, NY (US); Raya Horesh, North Salem, NY (US); Giacomo Nannicini, New York, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 393 days.

(21) Appl. No.: 15/850,200

(22) Filed: Dec. 21, 2017

(65) Prior Publication Data

US 2019/0197079 A1 Jun. 27, 2019

(51) Int. Cl.
| | |
|---|---|
| *G06F 17/00* | (2019.01) |
| *G06F 17/10* | (2006.01) |
| *G06N 20/00* | (2019.01) |
| *G06F 30/00* | (2020.01) |

(52) U.S. Cl.
CPC .............. *G06F 17/10* (2013.01); *G06F 30/00* (2020.01); *G06N 20/00* (2019.01)

(58) Field of Classification Search
CPC .......... G06N 3/126; G06N 7/02; G06N 20/00; G06F 3/04895; G06F 30/3323; G06F 17/10; G06F 30/00; G05B 13/0265; A45F 5/10; H02J 3/06; G05D 7/0635
See application file for complete search history.

(56) References Cited

U.S. PATENT DOCUMENTS

| | | | | |
|---|---|---|---|---|
| 5,136,686 | A * | 8/1992 | Koza | G06N 3/126 706/13 |
| 5,553,195 | A | 9/1996 | Meijer | |
| 6,460,024 | B1 * | 10/2002 | Smith | G06N 3/02 706/26 |
| 8,943,113 | B2 | 1/2015 | Yi | |
| 2003/0053275 | A1 * | 3/2003 | Rehtanz | H02J 3/06 361/115 |
| 2006/0057594 | A1 * | 3/2006 | Wang | G06F 30/3323 435/6.11 |
| 2009/0164935 | A1 * | 6/2009 | Feigenbaum | G06F 3/04895 715/780 |

(Continued)

OTHER PUBLICATIONS

Anonymous, "Leveraging Domain Knowledge to Create Semi-Automated Training Set for Supervised Machine Learning Classification System with Feedback Loop," IPCOM000195709D, May 2010, 4 pages.

(Continued)

*Primary Examiner* — Kandasamy Thangavelu
(74) *Attorney, Agent, or Firm* — Cantor Colburn LLP; Anthony Curro

(57) ABSTRACT

A method includes receiving, by a controller, a set of data. The set of data includes data of at least one explanatory variable and data of at least one response variable. The method also includes receiving, by the controller, an input that identifies a relevant explanatory variable. The method also includes generating, by the controller, an output data that corresponds to a symbolic expression that represents a relationship between the at least one explanatory variable and the at least one response variable. The symbolic expression is responsive to the identified relevant explanatory variable, and the symbolic expression includes a mathematically stable expression.

21 Claims, 7 Drawing Sheets

(56) References Cited

U.S. PATENT DOCUMENTS

| | | | | |
|---|---|---|---|---|
| 2009/0240366 A1* | 9/2009 | Kaushal | ............. | G05B 13/0265 700/110 |
| 2010/0138026 A1* | 6/2010 | Kaushal | ............. | G05B 13/0265 700/104 |
| 2013/0097810 A1* | 4/2013 | Ackerman | ................ | A45F 5/10 16/430 |
| 2015/0318697 A1 | 11/2015 | Wang et al. | | |
| 2017/0004231 A1 | 1/2017 | Avron et al. | | |
| 2017/0068257 A1* | 3/2017 | Quinones | ............. | G05D 7/0635 |
| 2018/0089577 A1* | 3/2018 | Ruiz | ........................ | G06N 7/02 |
| 2018/0292811 A1* | 10/2018 | Baseman | ........... | G05B 19/4188 |

OTHER PUBLICATIONS

Anonymous, "Method and System for Improving a Regular Expression for Extracting Data from Unstructured Text," IPCOM000203501D, Jan. 2011, 5 pages.

Anonymous, "Symbolic Regression for Big Data Driven Physics Modeling," IPCOM000250347D, Jul. 2017, 5 pages.

Austel et al., "Globally Optimal Symbolic Regression," arXiv preprint arXiv:1710.10720, 2017, 6 pages.

Demaille, "Derived-Term Automata of Multitape Rational Expressions (Long version)," arXiv preprint arXiv:1608.00749, 2016, 18 pages.

Horesh et al., "Globally Optimal Mixed Integer Non-Linear Programming (MINLP) Formulation for Symbolic Regression," 2016, 10 pages.

Moss, "Derivatives of Parsing Expression Grammars," arXiv preprint arXiv:1405.4841, 2014, 14 pages.

Schmidt et al., "Distilling Free-Form Natural Laws from Experimental Data," Science, vol. 324, 2009, pp. 81-85.

Todorovski et al., "Using equation discovery to revise an Earth ecosystem model of the carbon net production," Ecological Modelling 170, 2003, pp. 141-154.

\* cited by examiner

STABLE DATA-DRIVEN DISCOVERY OF A SYMBOLIC EXPRESSION

TECHNICAL FIELD

The present invention relates to automatically determining a stable symbolic expression for use in a computer-based modeling system.

SUMMARY

A method according to one or more embodiments of the invention includes receiving, by a controller, a set of data. The set of data includes data of at least one explanatory variable and data of at least one response variable. The method also includes receiving, by the controller, an input that identifies a relevant explanatory variable. The method also includes generating, by the controller, an output data that corresponds to a symbolic expression that represents a relationship between the at least one explanatory variable and the at least one response variable. The symbolic expression is responsive to the identified relevant explanatory variable, and the symbolic expression includes a mathematically stable expression.

A computer system according to one or more embodiments of the invention includes a memory and a processor system communicatively coupled to the memory. The processor system is configured to perform a method including receiving a set of data. The set of data includes data of at least one explanatory variable and data of at least one response variable. The method also includes receiving an input that identifies a relevant explanatory variable. The method also includes generating an output data that corresponds to a symbolic expression that represents a relationship between the at least one explanatory variable and the at least one response variable. The symbolic expression is responsive to the identified relevant explanatory variable, and the symbolic expression includes a mathematically stable expression.

A computer program product according to one or more embodiments of the invention includes a computer-readable storage medium having program instructions embodied therewith. The program instructions are readable by a processor system to cause the processor system receive a set of data. The set of data includes data of at least one explanatory variable and data of at least one response variable. The processor system can also be caused to receive an input that identifies a relevant explanatory variable. The processor system can also be caused to generate an output data that corresponds to a symbolic expression that represents a relationship between the at least one explanatory variable and the at least one response variable. The symbolic expression is responsive to the identified relevant explanatory variable, and the symbolic expression includes a mathematically stable expression.

A computer-implemented method according to one or more embodiments of the invention includes receiving, by a symbolic expression discovery engine, a set of data. The set of data includes data of at least one explanatory variable and data of at least one response variable. The method also includes receiving, by the symbolic expression discovery engine, an input that identifies a relevant explanatory variable. The method also includes learning, by the symbolic expression discovery engine, a relationship between the at least one explanatory variable and the at least one response variable. The method also includes generating, by the symbolic expression discovery engine, an output data that corresponds to a symbolic expression that represents the relationship between the at least one explanatory variable and the at least one response variable. The symbolic expression is responsive to the identified relevant explanatory variable, and the symbolic expression includes a mathematically stable expression.

A symbolic expression discovery system according to one or more embodiments of the invention includes a plurality of interconnected processor elements. Connections between the processor elements are configured with numerical weights that correspond to a strength or weakness of a given connection. The plurality of interconnected processor elements are configured to perform a method including receiving a set of data. The set of data includes data of at least one explanatory variable and data of at least one response variable. The method also includes receiving an input that identifies a relevant explanatory variable. The method also includes generating an output data that corresponds to a symbolic expression that represents a relationship between the at least one explanatory variable and the at least one response variable. The symbolic expression is responsive to the identified relevant explanatory variable, and the symbolic expression includes a mathematically stable expression.

BRIEF DESCRIPTION OF THE DRAWINGS

The subject matter of one or more embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
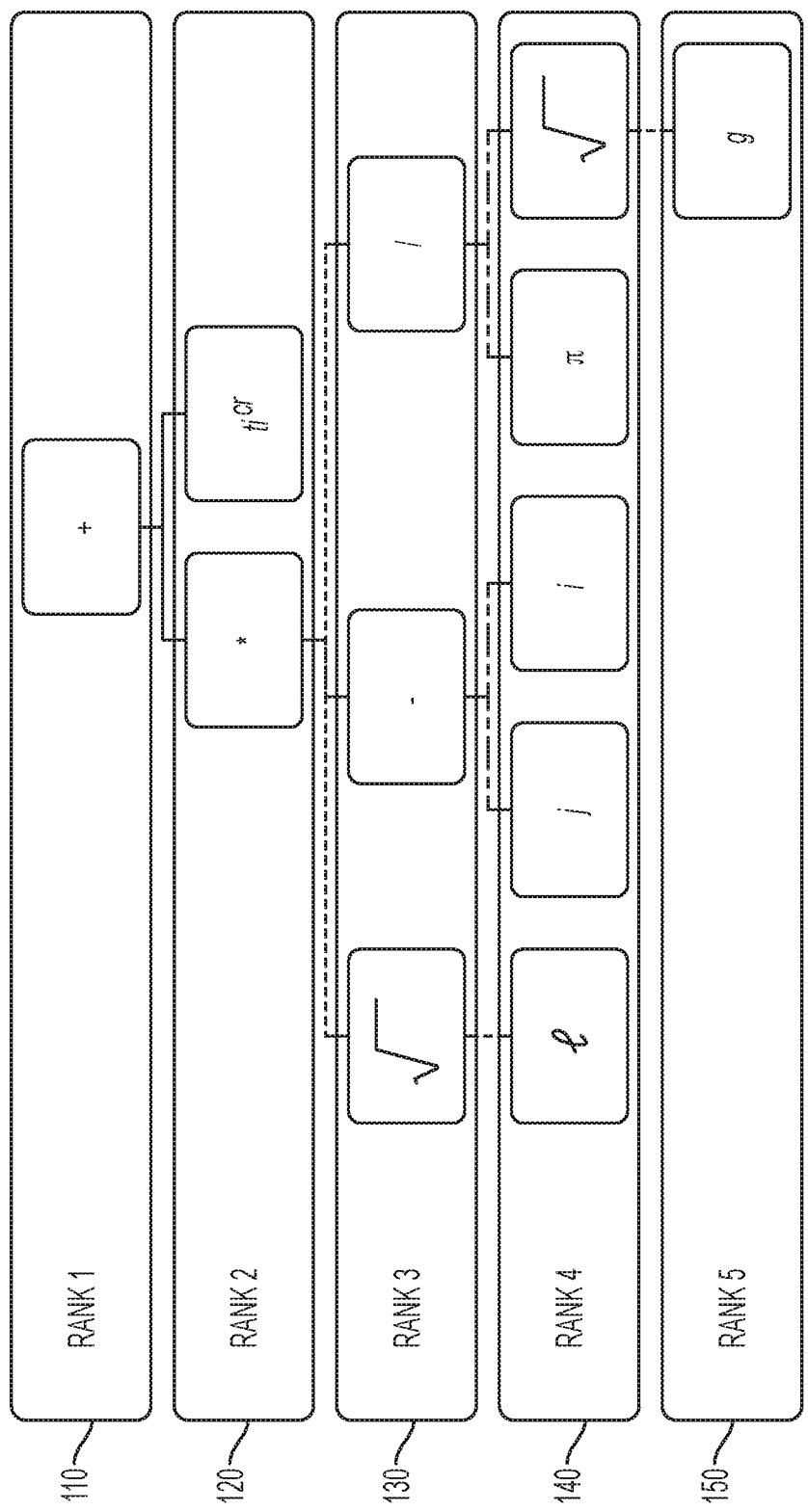
FIG. 1 illustrates a symbolic expression that is represented via an expression tree in accordance with one or more embodiments of the invention.

In accordance with one or more embodiments of the invention, methods and computer program products for automatically determining a stable symbolic expression are provided. Various embodiments of the invention are described herein with reference to the related drawings. Alternative embodiments of the invention can be devised without departing from the scope of this invention. References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments of the invention whether or not explicitly described.

Additionally, although this disclosure includes a detailed description of a computing device configuration, implementation of the teachings recited herein are not limited to a particular type or configuration of computing device(s). Rather, embodiments of the present disclosure are capable of being implemented in conjunction with any other type or configuration of wireless or non-wireless computing devices and/or computing environments, now known or later developed.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments of the invention or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

For the sake of brevity, conventional techniques related to computer processing systems and computing models may or may not be described in detail herein. Moreover, it is understood that the various tasks and process steps described herein can be incorporated into a more comprehensive procedure, process or system having additional steps or functionality not described in detail herein.

Computer-based modeling using so-called "symbolic expressions" can be used to explain relationships between explanatory variables and response variables of a variety of systems, including, for example, a phenomenon. For example, explanatory variables such as temperature, humidity, barometric pressure, and wind speed can possibly affect a response such as a precipitation level. As another example, explanatory variables such as fertilizer amount, hours of sunlight, and water amount can possibly affect a response variable such as an amount of plant growth. A symbolic expression can be a mathematical expression that represents an aspect of a system or other phenomenon.

In order to determine a symbolic expression that models a set of data relating to a system or a phenomenon, the user can input the set of data into a machine-learning system, and the machine-learning system can determine the symbolic expression. The inputted data (relating to the system or phenomenon) can be a set of data that includes one or more explanatory variables and one or more response variables. The response variable can be dependent on the one or more explanatory variables. Determining a symbolic expression that accurately models/represents the data includes generating a symbolic expression that accurately expresses a mathematical relationship, if any, between the data of the explanatory variables and the data of the response variables. The inputted data can be referred to as a set of "training data" for the machine-learning system because the machine-learning system learns the relevant relationships between the variables by analyzing the inputted set of data.

Determining the symbolic expression can be difficult because the symbolic expression can take any form, with any combination of operators, operands, and constant coefficients. When determining the functional form of a symbolic expression, there can be a vast number of possible functional forms to explore. Further, symbolic expressions that describe a system or a phenomenon can be complex mathematical expressions.

The conventional approaches of determining the symbolic expression generally yielded a large number of possible symbolic expressions, where many of the possible symbolic expressions would use variables and numerical constants that are entirely unrelated to the system/phenomenon to be explained. For example, in order to explain a system/phenomenon relating to plant growth, the conventional approaches would typically generate symbolic expressions which use entirely unrelated variables such as, for example, the rest energy of a mass (i.e., $E=mc^2$). Therefore, the conventional approaches of determining symbolic expressions typically generated a large number of nonsensical symbolic expressions.

In contrast to the conventional approaches, one or more embodiments of the invention can generate symbolic expressions that use variables that are more relevant to the system/phenomenon to be explained, as described in more detail below. Thus, one or more embodiments of the invention can generate symbolic expressions that are more likely to accurately reflect the system/phenomenon.

A user can be aware of one or more relevant explanatory variables that should be included in a generated symbolic expression, where the generated symbolic expression expresses a mathematical relationship between data of at least one explanatory variable and data of at least one response variable. With one or more embodiments of the present invention, the user can identify these relevant explanatory variables to the machine-learning system. The identified explanatory variable(s) can be a subset of the group of explanatory variables that are a part of the overall training set of the machine-learning system. By indicating (to the machine-learning system) that one or more explanatory variables need to be included within the generated symbolic expression, the user can reduce the number of erroneous symbolic expressions that are generated by the machine-learning system. Therefore, in contrast to the conventional approaches, with one or more embodiments of the invention, the user can thus focus the machine-learning system on generating symbolic expressions that are more likely to accurately reflect the system/phenomenon.

In order to ensure that a symbolic expression includes an explanatory variable that has been identified as a relevant explanatory variable, one or more embodiments are configured to ensure that the symbolic expression is sensitive to the identified relevant explanatory variable. In other words, with one or more embodiments of the invention, the output of the symbolic expression (which can be intended to represent the results of a response variable) needs to be responsive to the relevant explanatory variable, as described in more detail below.

Additionally, the generated symbolic expression should model the system/phenomenon in a stable manner. If the symbolic expression is a stable model, then the output of each symbolic expression and the value of each internal state of the symbolic expression (i.e., the output of a sub-expression within the symbolic expression) is to be limited within bounds. If an output of the symbolic expression or a value of an internal state of the symbolic expression can increase without limit, then the symbolic expression exhibits instability. A sub-expression can be a portion of the overall symbolic expression, where each sub-expression of the overall symbolic expression can be joined to one or more other sub-expressions with an operator.

Symbolic expressions that exhibit instability are undesirable because, although they can possibly be an accurate model for certain aspects of the system/phenomenon, certain inputs of the explanatory variables will cause the model to exhibit instability and thus the symbolic expression will abruptly deviate from being an accurate model for the system/phenomenon. Because it is desirable for a symbolic expression to exhibit stability when modeling the system/phenomenon, there is a need to determine/generate symbolic expressions that do not have internal sub-expressions which can result in unstable behavior with certain values of explanatory variable inputs. Therefore, one or more embodiments of the invention are directed to a system and method for automatically determining a symbolic expression that is also a stable model, as described in more detail below.

Further, in order to ensure that each of the generated symbolic expressions is a discernible mathematical statement, one or more embodiments of the invention can provide a set of grammatical rules that define a valid expression syntax for the symbolic expression. For example, one grammatical rule can be that there cannot be two consecutive operators in a valid symbolic expression. Therefore, symbolic expressions containing "++", "−−", "x x", etc., can be considered to have an invalid expression syntax. Another example grammatical rule can be that each pair of operands is to have an operator between them. As such, by ensuring that the generated symbolic expression follows a valid expression syntax, one or more embodiments of the invention can ensure that the generated symbolic expression is a discernible mathematical statement.

The operators of the generated symbolic expression can be provided by a user. Alternatively, the operators can be chosen from a set of pre-stored operators by the machine-learning system. The operators can be mathematical symbols such as, for example, symbols for addition, subtraction, multiplication, division, square root, cosine, sine, exponents, etc. In addition to providing the set of operators to be used by the generated symbolic expression, one or more embodiments of the invention also provide a set of input explanatory variables and constants that can be possibly combined to generate the symbolic expression.

One or more embodiments of the present invention can also determine a symbolic expression that is an expression of minimal complexity. The complexity of the symbolic expression can be of minimal Kolmogorov complexity, for example. Further, in order to ensure that the symbolic expression accurately represents the data of the response variables, output of the generated symbolic expression does not deviate from the data of the response variables beyond a given threshold. The given threshold can be configured according to a given discrepancy measurement that is provided by the user, as described in more detail below.

As described above, with one or more embodiments of the invention, a user can identify at least one explanatory variable as being a relevant explanatory variable. The machine-learning system generates the symbolic expression based at least on the identified relevant explanatory variable. As discussed above, one or more embodiments of the invention ensures that the generated symbolic expression is sensitive to the identified relevant explanatory variable. In other words, the symbolic expression is responsive to the at least one relevant explanatory variable that is identified/received from the user.

In order to determine whether a symbolic expression is sensitive to, or more specifically, sufficiently responsive to, an explanatory variable (that has been identified as a relevant explanatory variable), one or more embodiments of the invention calculates the derivative of the symbolic expression with respect to the relevant explanatory variable and then determines whether the calculated derivative is a non-zero expression. If the calculated derivative is a non-zero expression, then the symbolic expression is determined to be sensitive/responsive to the relevant explanatory variable.

In order to calculate the derivative of the symbolic expression, one or more embodiments of the invention can determine the sub-expressions that make up the overall symbolic expression. Upon determining the sub-expressions of the overall symbolic expression, one or more embodiments of the present invention can then compute partial derivatives of each sub-expression with respect to the relevant explanatory variable (i.e., the Jacobian). After computing the partial derivatives of each sub-expression, one or more embodiments of the invention can then recombine the partial derivatives in accordance to the relevant mathematical rules in order to determine whether the derivative of the overall symbolic expression is a non-zero expression, or an expression that is sufficiently larger than zero. As described above, if the calculated derivative of the symbolic expression is a non-zero expression, then the symbolic expression is determined to be sensitive to the relevant explanatory variable.

Further, as described above, in addition to ensuring that the symbolic expression is sensitive to the relevant input explanatory variable, one or more embodiments of the invention also automatically determine a symbolic expression that is a stable symbolic expression. In order to determine whether the symbolic expression is a stable expression, one or more embodiments of the invention is configured to compute the reciprocals of each partial derivative of each sub-expression. In order to ensure that the symbolic expression is stable, the reciprocals have to be contained within a given range. This threshold range can be established by boundary inputs that are received by the user.

One or more embodiments of the invention is configured to compute the eigenvalues of each partial derivative of each sub-expression. With one or more embodiments of the invention, in order to ensure that the symbolic expression is stable, the real part of the eigenvalues have to be contained within a given range. This threshold range can be established by a Lyapunov stability criteria.

One or more embodiments of the invention can allow a user to moderate a tradeoff between a sensitivity and a stability of the determined symbolic expression. Other embodiments of the invention can automatically balance the sensitivity and the stability of the determined symbolic expression in accordance to a user-defined ratio.

FIG. 1 illustrates a symbolic expression that is represented via a computer-implemented expression tree in accordance with one or more embodiments of the invention. The expression tree can be a data structure that is stored and used by one or more embodiments of the invention. In the example of FIG. 1, suppose that a determined symbolic expression is:

$$\left(\sqrt{l} \times (j-i) \times \frac{\pi}{\sqrt{g}}\right) + ti^{cr}$$

One or more embodiments of the invention can express the symbolic expression within the expression tree by determining the operands and the operators which form the sub-expressions of the symbolic expression. Referring to FIG. 1, each level (i.e., ranks 110, 120, 130, 140, and 150) of the expression tree corresponds to a sub-expression of the overall expression, where the top level 110 corresponds to the entire symbolic expression. From the top of the expression tree to the bottom of the expression tree, the operators are arranged in reverse-order compared to the order in which the operators are applied in the mathematical statement. For example, according to mathematical order-of-operations, the "+" of top level 110 is applied last when mathematically calculating the above symbolic expression.

Figure 2:
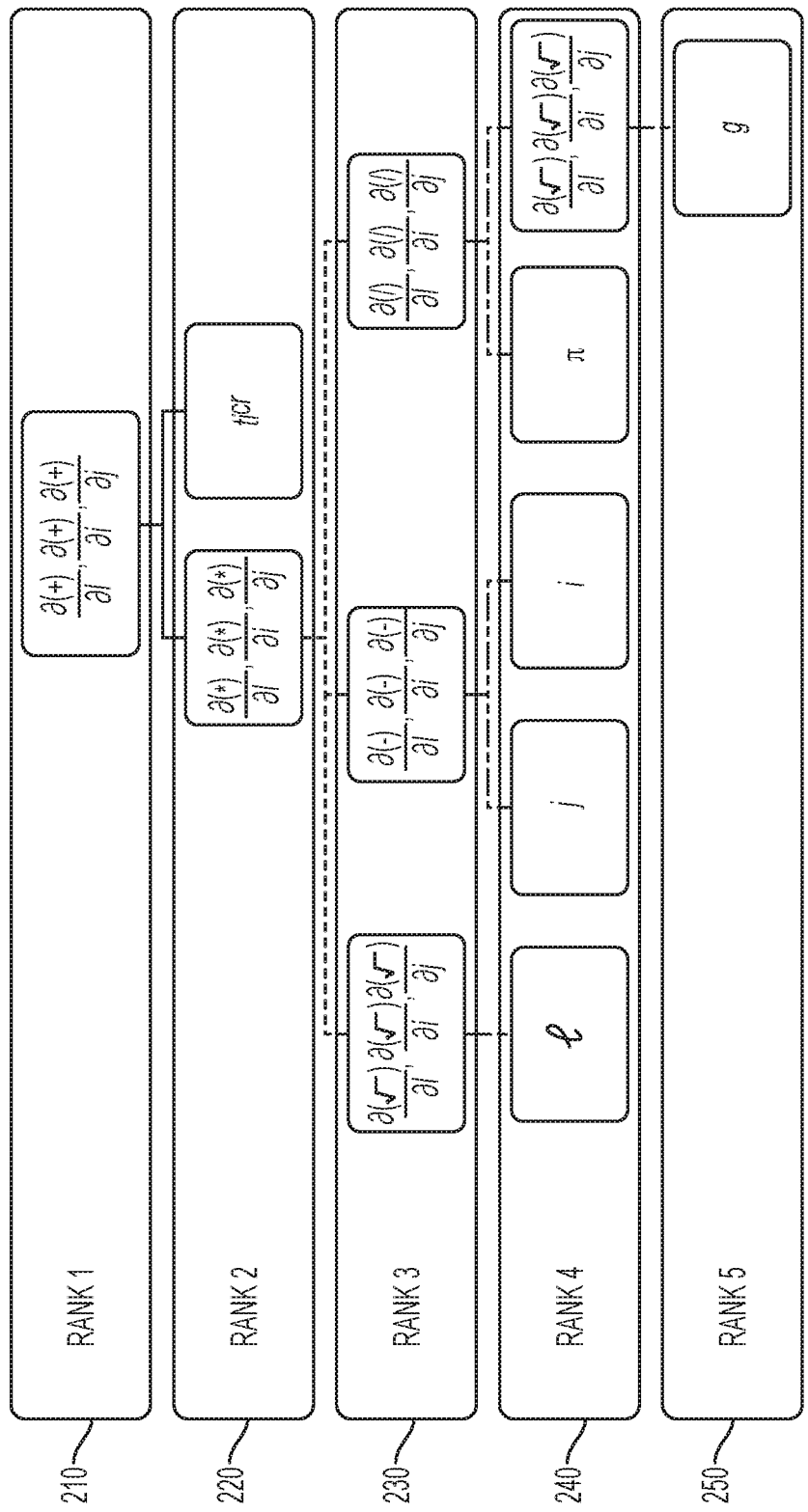
FIG. 2 illustrates computing partial derivatives of sub-expressions of the symbolic expression in accordance with one or more embodiments of the invention.

FIG. 2 illustrates partial derivatives of sub-expressions of the symbolic expression that is represented via the expression tree in accordance with one or more embodiments of the invention. As described above, one or more embodiments of the invention calculates the derivative of the symbolic expression with respect to one or more relevant explanatory variables and determines whether the calculated derivative is a non-zero expression. If the calculated derivative is a non-zero expression, then the symbolic expression is determined to be sensitive to the relevant explanatory variable. In the example of FIG. 2, suppose that the user has identified/inputted "l," "i," and "j" as the relevant explanatory variables. As such, the generated symbolic expression is determined to be sensitive to "l," "i," and/or "j" if the calculated derivatives (below) of the symbolic expression (with respect to each of these variables) are non-zero expressions.

$$\frac{\partial}{\partial l}\left(\left(\sqrt{l} \times (j-i) \times \frac{\pi}{\sqrt{g}}\right) + ti^{cr}\right)$$

$$\frac{\partial}{\partial i}\left(\left(\sqrt{l} \times (j-i) \times \frac{\pi}{\sqrt{g}}\right) + ti^{cr}\right)$$

$$\frac{\partial}{\partial j}\left(\left(\sqrt{l} \times (j-i) \times \frac{\pi}{\sqrt{g}}\right) + ti^{cr}\right)$$

One or more embodiments of the invention can determine the above derivatives by first determining the sub-expressions of the overall symbolic expression. Upon determining the sub-expressions of the overall symbolic expression, one or more embodiments of the invention can then compute partial derivatives of each sub-expression with respect to each of the relevant explanatory variables. After computing the partial derivatives of each sub-expression (of each of the ranks 220, 230, 240, and 250), one or more embodiments of the invention can then recombine the partial derivatives in accordance to the relevant mathematical rules in order to determine whether the derivative of the overall symbolic expression is a non-zero expression. For example, the partial derivatives of rank 230 can be combined to compute the partial derivative of rank 220. In the example of FIG. 2, in order ensure that the symbolic expression is sensitive to each of the relevant explanatory variables "l", "i," and "j", one or more embodiments of the invention ensures that each of the derivatives (with respect to each variable) is sufficiently larger than zero.

Further, one or more embodiments of the invention ensures that the determined/generated symbolic expression is stable. In order to ensure that the symbolic expression is stable, one or more embodiments of the present invention ensures that the calculated reciprocals of each partial derivative is bounded.

Figure 3:
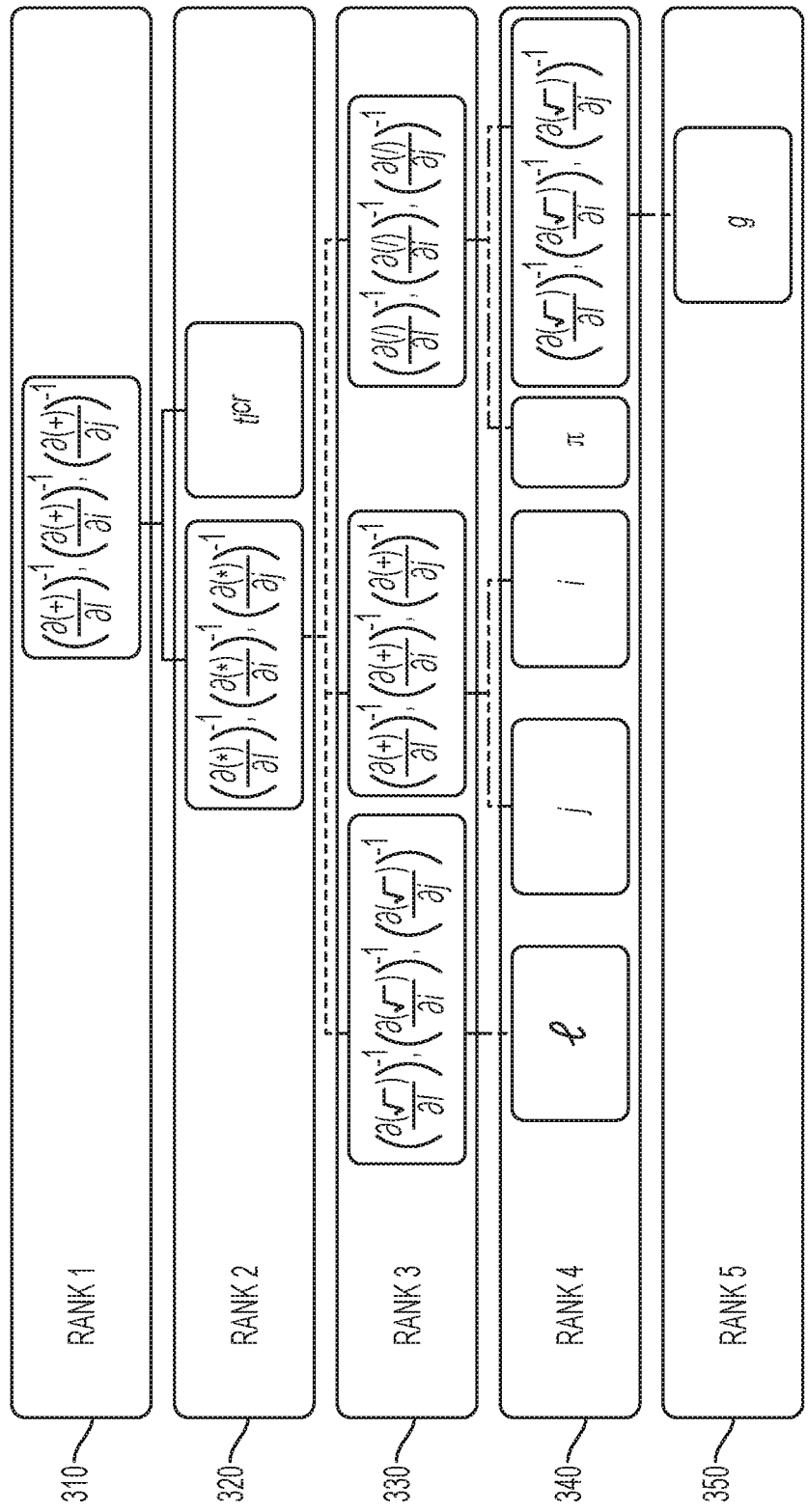
FIG. 3 illustrates computing reciprocals of the partial derivatives in accordance with one or more embodiments of the invention.

FIG. 3 illustrates computing reciprocals of the partial derivatives of the sub-expressions in accordance with one or more embodiments of the invention. After computing the partial derivatives of each sub-expression (as shown in FIG. 2), one or more embodiments of the invention can compute reciprocals of each partial derivative (of each of the ranks 310, 320, 330, 340, and 350). As described above, in order to determine whether the symbolic expression is a stable expression, one or more embodiments of the invention is configured to ensure that the reciprocals are contained within a threshold range. The threshold range can be established by inputs that are received by the user.

In another embodiment, the reciprocals of the partial derivatives can be replaced by computation of the real part of the eigenvalues of the partial derivatives, and one or more embodiments can ensure that these terms are negative or bounded.

Figure 4:
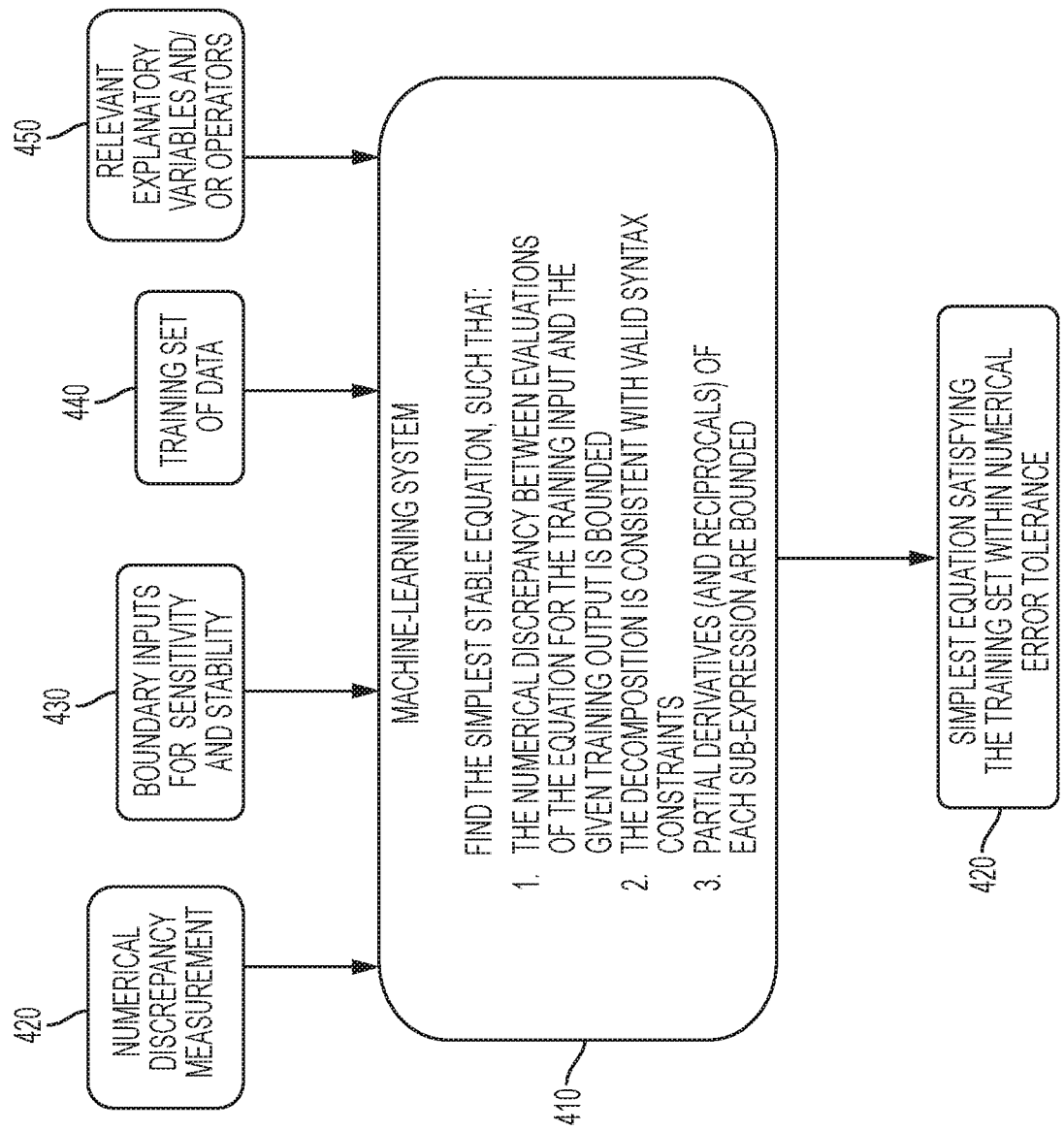
FIG. 4 illustrates inputs and outputs of a machine-learning system in accordance with one or more embodiments of the invention.

FIG. 4 illustrates inputs and outputs of a machine-learning system 410 in accordance with one or more embodiments of the invention. As described above, with one or more embodiments of the invention, a user provides a numerical discrepancy measurement 420. As described above, in order to ensure that the generated symbolic expression accurately represents the set of inputted data, one or more embodiments of the invention ensures that the output that is produced by the generated symbolic expression does not deviate from the data of the response variables beyond a given threshold. This threshold can be based on the user-provided numerical discrepancy measurement 420.

With one or more embodiments of the invention, a user provides boundary inputs 430 for determining sensitivity and/or stability. As described above, in order to ensure that the generated symbolic expression is stable, the above-described computed reciprocals of the partial derivatives have to be contained within a threshold range. The threshold range can be established by the user-provided boundary inputs 430. Further, the user can moderate the tradeoff between the sensitivity and the stability of the generated symbolic expression based on the boundary inputs 430. Other embodiments of the invention can automatically balance the sensitivity and the stability of the determined symbolic expression in accordance to user-provided boundary inputs 430.

With one or more embodiments of the invention, the user can input a training set of data 440 regarding the system/phenomenon into the machine-learning system 410. As described above, this training set of data 440 corresponds to the data of explanatory variables and the data of response variables that the generated symbolic expression should model/represent. Based on the training set of data 440, the machine-learning system 410 can determine the symbolic expression that adequately models/represents the inputted data 440.

With one or more embodiments of the invention, a user can also identify/provide one or more relevant explanatory variables and/or operators 450 that are to be used by the machine-learning system 410 to determine the symbolic expression. As described above, the identified explanatory variable is a variable that the generated symbolic expression has to be sensitive to. Also, if a set of operators is provided by the user, one or more embodiments of the invention can also apply a grammatical rule set to ensure that the symbolic expression meets all syntax requirements.

Upon receiving the inputs, the machine-learning system 410 determines a stable symbolic expression that represents the system/phenomenon. The symbolic expression is consistent with valid syntax constraints. Further, the above-described partial derivatives and reciprocals are bounded within appropriate thresholds. The thresholds can be determined by boundary inputs 430.

Finally, the machine-learning system 410 outputs data 420 that: (1) corresponds to the symbolic expression that represents the inputted set of data 440, (2) is sensitive to the relevant explanatory variables 450, and (3) is also a stable model.

Figure 5:
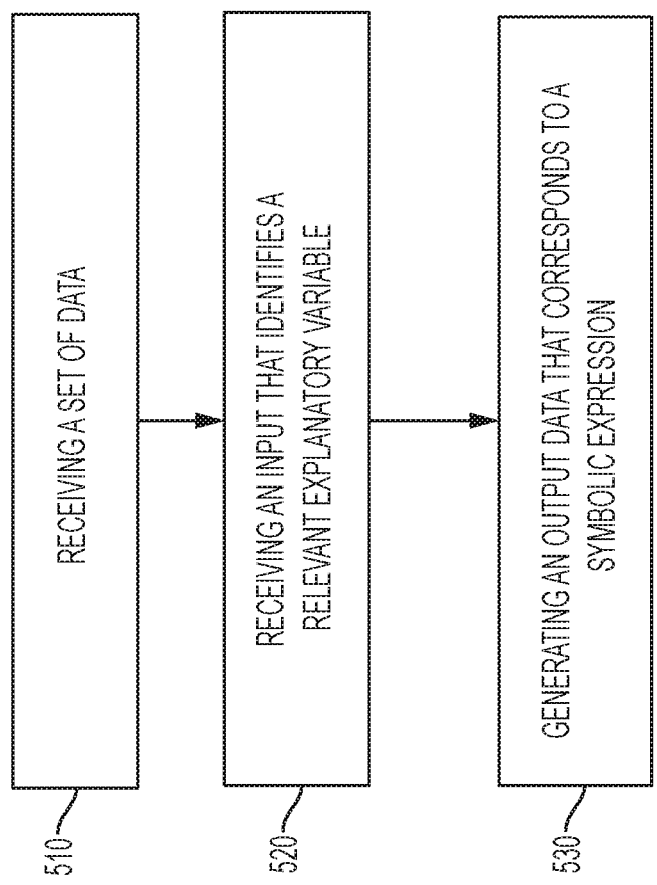
FIG. 5 depicts a flowchart of a method, in accordance with one or more embodiments of the invention.

FIG. 5 depicts a flowchart of a method in accordance with one or more embodiments of the invention. The method of FIG. 5 can be performed by a controller of a system that is configured to generate symbolic expressions. The method of FIG. 5 can be performed by a symbolic expression discovery system. The symbolic expression discovery system can be based on, for example, a mathematical program in which a free-form search is performed for both a functional form of an expression as well as a parametrization. The system comprises of a set of operator primitives articulated as symbols, as well as a set of symbolic parameters and coefficients. The system seeks to find an expression comprising operators, variables, and coefficients, where the expression is of minimal complexity (e.g., measured through Kolmogorov complexity) and that is consistent with the grammatical rules. Evaluation of the expression across all input training points will not deviate from the corresponding output set by a given threshold, for a given discrepancy measure.

Another example embodiment can be implemented using one or more artificial neural networks (ANNs), which can use electronic components that mimic the processing architecture of the human brain. Symbolic expression discovery engines can be implemented by so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, with one or more embodiments of the invention, an ANN can learn a relationship between one or more explanatory variables and one or more response variables.

The method includes, at block 510, receiving, by a controller, a set of data. The set of data includes data of at least one explanatory variable and data of at least one response variable. The method also includes, at block 520, receiving, by the controller, an input that identifies a relevant explanatory variable. The method also includes, at block 530, generating, by the controller, an output data that corresponds to a symbolic expression that represents a relationship between the at least one explanatory variable and the at least one response variable. The symbolic expression is responsive to the identified relevant explanatory variable, and the symbolic expression includes a mathematically stable expression.

Figure 6:
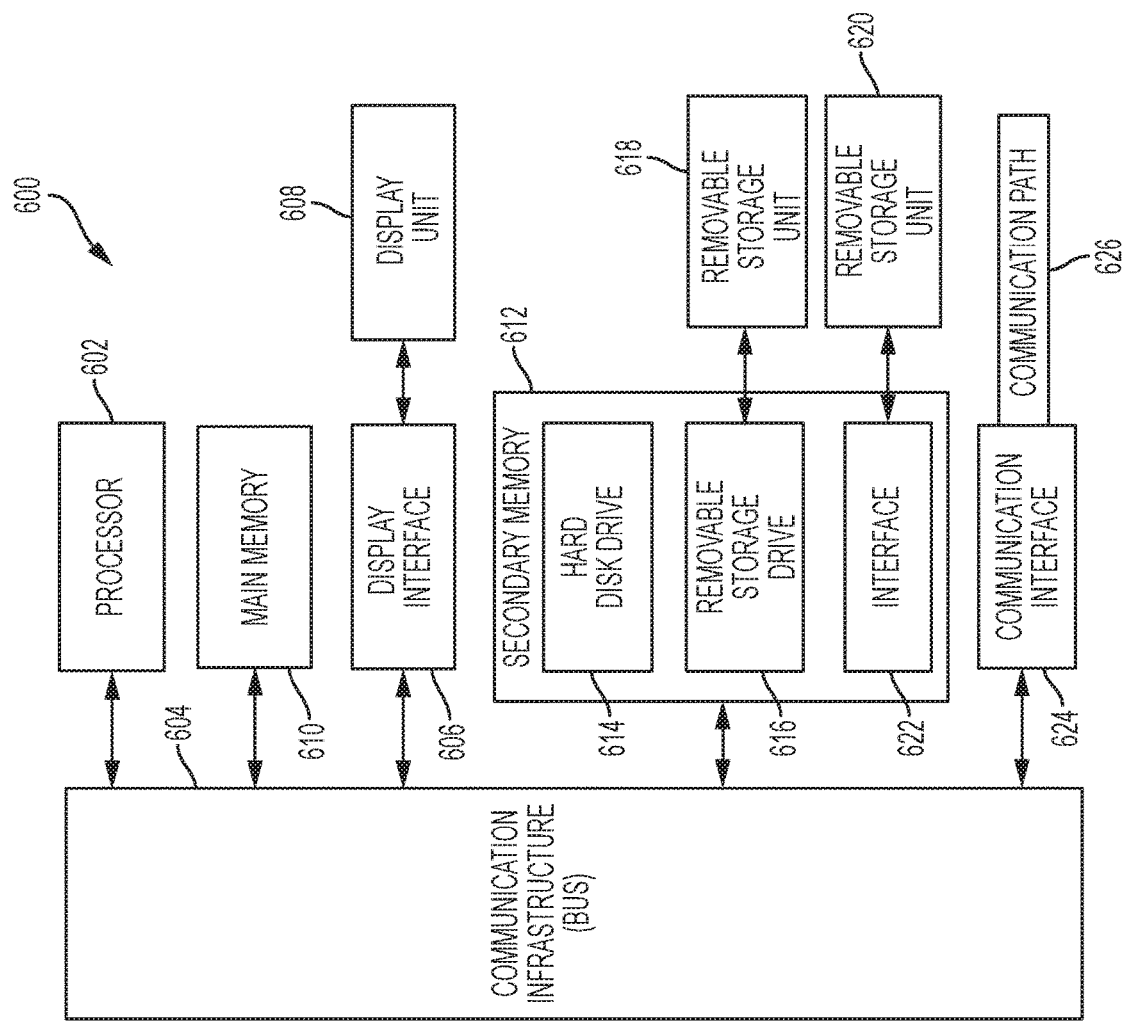
FIG. 6 depicts a high-level block diagram of a computer system, which can be used to implement one or more embodiments of the invention.

FIG. 6 depicts a high-level block diagram of a computer system 600, which can be used to implement one or more embodiments of the invention. Computer system 600 can correspond to, at least, a machine-learning system that is configured to determine a symbolic expression, for example. Computer system 600 can be used to implement hardware components of systems capable of performing methods described herein. Although one exemplary computer system 600 is shown, computer system 600 includes a communication path 626, which connects computer system 600 to additional systems (not depicted) and can include one or more wide area networks (WANs) and/or local area networks (LANs) such as the Internet, intranet(s), and/or wireless communication network(s). Computer system 600 and additional system are in communication via communication path 626, e.g., to communicate data between them.

Computer system 600 includes one or more processors, such as processor 602. Processor 602 is connected to a communication infrastructure 604 (e.g., a communications bus, cross-over bar, or network). Computer system 600 can include a display interface 606 that forwards graphics, textual content, and other data from communication infrastructure 604 (or from a frame buffer not shown) for display on a display unit 608. Computer system 600 also includes a main memory 610, preferably random access memory (RAM), and can also include a secondary memory 612. Secondary memory 612 can include, for example, a hard disk drive 614 and/or a removable storage drive 616, representing, for example, a floppy disk drive, a magnetic tape drive, or an optical disc drive. Hard disk drive 614 can be in the form of a solid state drive (SSD), a traditional magnetic disk drive, or a hybrid of the two. There also can be more than one hard disk drive 614 contained within secondary memory 612. Removable storage drive 616 reads from and/or writes to a removable storage unit 618 in a manner well known to those having ordinary skill in the art. Removable storage unit 618 represents, for example, a floppy disk, a compact disc, a magnetic tape, or an optical disc, etc. which is read by and written to by removable storage drive 616. As will be appreciated, removable storage unit 618 includes a computer-readable medium having stored therein computer software and/or data.

In alternative embodiments of the invention, secondary memory 612 can include other similar means for allowing computer programs or other instructions to be loaded into the computer system. Such means can include, for example, a removable storage unit 620 and an interface 622. Examples of such means can include a program package and package interface (such as that found in video game devices), a removable memory chip (such as an EPROM, secure digital card (SD card), compact flash card (CF card), universal serial bus (USB) memory, or PROM) and associated socket, and other removable storage units 620 and interfaces 622 which allow software and data to be transferred from the removable storage unit 620 to computer system 600.

Computer system 600 can also include a communications interface 624. Communications interface 624 allows software and data to be transferred between the computer system and external devices. Examples of communications interface 624 can include a modem, a network interface (such as an Ethernet card), a communications port, or a PC card slot and card, a universal serial bus port (USB), and the like. Software and data transferred via communications interface 624 are in the form of signals that can be, for example, electronic, electromagnetic, optical, or other signals capable of being received by communications interface 624. These signals are provided to communications interface 624 via a communication path (i.e., channel) 626. Communication path 626 carries signals and can be implemented using wire or cable, fiber optics, a phone line, a cellular phone link, an RF link, and/or other communications channels.

In the present description, the terms "computer program medium," "computer usable medium," and "computer-readable medium" are used to refer to media such as main memory 610 and secondary memory 612, removable storage drive 616, and a hard disk installed in hard disk drive 614. Computer programs (also called computer control logic) are stored in main memory 610 and/or secondary memory 612. Computer programs also can be received via communications interface 624. Such computer programs, when run, enable the computer system to perform the features discussed herein. In particular, the computer programs, when run, enable processor 602 to perform the features of the computer system. Accordingly, such computer programs represent controllers of the computer system. Thus it can be seen from the foregoing detailed description that one or more embodiments of the invention provide technical benefits and advantages.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

Figure 7:
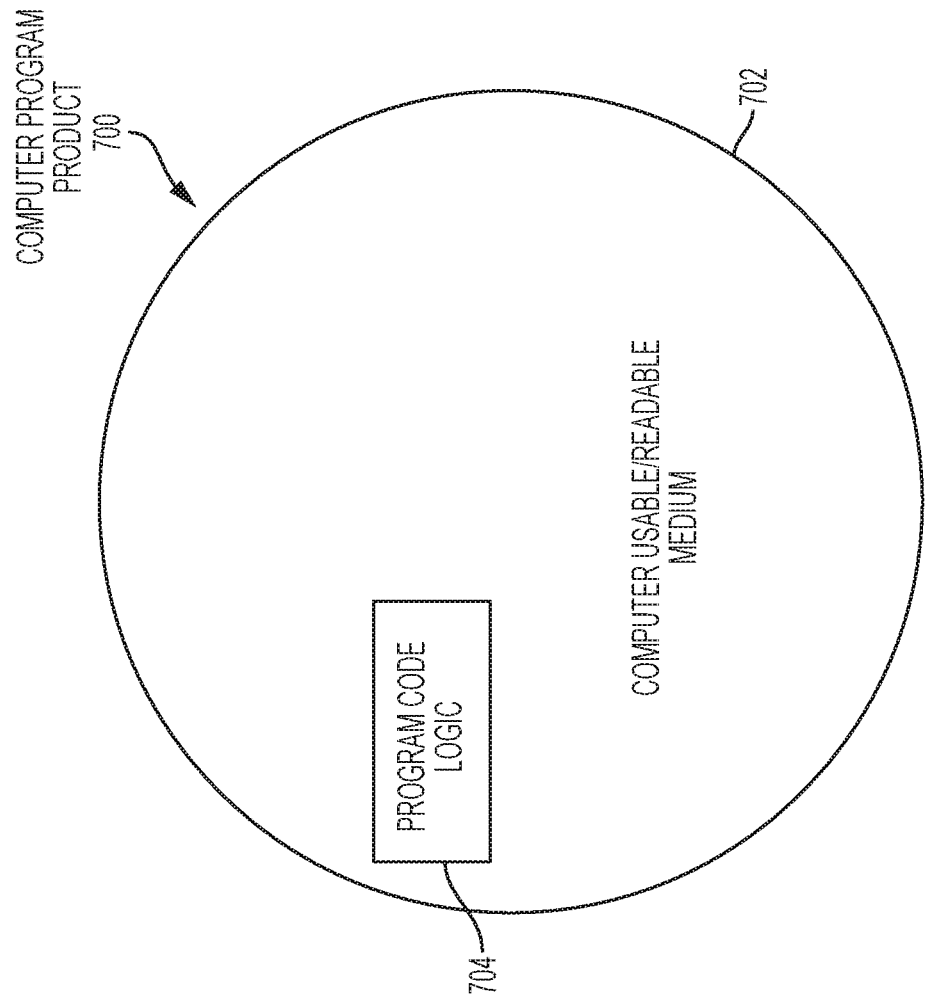
FIG. 7 depicts a computer program product, in accordance with one or more embodiments of the invention.

FIG. 7 depicts a computer program product 700, in accordance with an embodiment. Computer program product 700 includes a computer-readable storage medium 702 and program instructions 704.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments of the invention, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   receiving, by a controller implemented with a machine learning system, a set of data, wherein the set of data comprises data of at least one explanatory variable and data of at least one response variable;
   receiving, by the controller, an input that identifies one or more relevant explanatory variables;
   determining, using the machine learning system, a symbolic expression that represents the received set of data and includes the identified one or more relevant explanatory variables such that the controller learns a relationship between the at least one explanatory variable and the at least one response variable;
   generating, by the controller, an output data that corresponds to a symbolic expression that represents the relationship between the at least one explanatory variable and the at least one response variable, wherein the symbolic expression is responsive to the identified one or more relevant explanatory variables, and the symbolic expression comprises a mathematically stable expression, the stable expression defined by the output data of the symbolic expression and a value of each internal state of the symbolic expression being limited within bounds,
   wherein the symbolic expression corresponds to an expression of minimal complexity, and
   wherein the output data that is based on the symbolic expression having the minimal complexity does not deviate from the received data of the response variables beyond a threshold.

2. The computer-implemented method of claim 1, further comprising determining a set of grammatical rules that define a valid expression syntax for the symbolic expression, wherein the symbolic expression follows the set of grammatical rules.

3. The computer-implemented method of claim 1, wherein the symbolic expression being responsive to the identified one or more relevant explanatory variables corresponds to a symbolic expression whose derivative with respect to the identified one or more relevant explanatory variables is a non-zero expression.

4. The computer-implemented method of claim 3, further comprising determining the derivative of the symbolic expression with respect to the identified one or more relevant explanatory variables, wherein the determining the derivative comprises expressing sub-expressions of the symbolic expression within an expression tree and determining partial derivatives of the sub-expressions with respect to the identified one or more relevant explanatory variables.

5. The computer-implemented method of claim 4, wherein the generating the output data that corresponds to the symbolic expression comprises determining reciprocals or eigenvalues of the partial derivatives, and the determined reciprocals or the eigenvalues are bounded expressions.

6. The computer-implemented method of claim 5, wherein output data that is based on the symbolic expression does not deviate from the received data of the response variables beyond a threshold, and wherein a sensitivity and a stability of the symbolic expression are automatically balanced based on the reciprocals or the eigenvalues that are bounded according to the inputted data.

7. A computer system comprising:
   a memory; and
   a processor system implemented with a machine learning system communicatively coupled to the memory;
   the processor system configured to perform a method comprising:
   receiving a set of data, wherein the set of data comprises data of at least one explanatory variable and data of at least one response variable;
   receiving an input that identifies one or more relevant explanatory variables;
   determining, using the machine learning system, a symbolic expression that represents the received set of data and includes the identified one or more relevant explanatory variables such that the controller learns a relationship between the at least one explanatory variable and the at least one response variable;
   generating an output data that corresponds to a symbolic expression that represents the relationship between the at least one explanatory variable and the at least one response variable, wherein the symbolic expression is responsive to the identified one or more relevant explanatory variables, and the symbolic expression comprises a mathematically stable expression, the stable expression defined by the output data of the symbolic expression and a value of each internal state of the symbolic expression being limited within bounds, wherein the symbolic expression corresponds to an expression of minimal complexity, and wherein the output data that is based on the symbolic expression having the minimal complexity does not deviate from the received data of the response variables beyond a threshold.

8. The computer system of claim 7, wherein the method further comprises determining a set of grammatical rules that define a valid expression syntax for the symbolic expression, wherein the symbolic expression follows the set of grammatical rules.

9. The computer system of claim 7, wherein the symbolic expression being responsive to the identified one or more relevant explanatory variables corresponds to a symbolic expression whose derivative with respect to the identified one or more relevant explanatory variables is a non-zero expression.

10. The computer system of claim 9, wherein the method further comprises determining the derivative of the symbolic expression with respect to the identified one or more relevant explanatory variables, wherein the determining the derivative comprises expressing sub-expressions of the symbolic expression within an expression tree and determining partial derivatives of the sub-expressions with respect to the identified one or more relevant explanatory variables.

11. The computer system of claim 10, wherein the generating the output data that corresponds to the symbolic expression comprises determining reciprocals or eigenvalues of the partial derivatives, and the determined reciprocals or the eigenvalues are bounded expressions.

12. The computer system of claim 11, wherein output data that is based on the symbolic expression does not deviate from the received data of the response variables beyond a threshold, and wherein a sensitivity and a stability of the symbolic expression are automatically balanced based on the reciprocals or the eigenvalues that are bounded according to the inputted data.

13. A computer program product comprising a non-transitory computer-readable storage medium having program instructions embodied therewith, the program instructions readable by a processor system implemented with a machine learning system to cause the processor system to:

receive a set of data, wherein the set of data comprises data of at least one explanatory variable and data of at least one response variable;

receive an input that identifies one or more relevant explanatory variables;

determining, using the machine learning system, a symbolic expression that represents the received set of data and includes the identified one or more relevant explanatory variables such that the controller learns, a relationship between the at least one explanatory variable and the at least one response variable; and generate an output data that corresponds to a symbolic expression that represents the relationship between the at least one explanatory variable and the at least one response variable, wherein the symbolic expression is responsive to the identified one or more relevant explanatory variables, and the symbolic expression comprises a mathematically stable expression, the stable expression defined by the output data of the symbolic expression and a value of each internal state of the symbolic expression being limited within bounds, wherein the symbolic expression corresponds to an expression of minimal complexity, and wherein the output data that is based on the symbolic expression having the minimal complexity does not deviate from the received data of the response variables beyond a threshold.

14. The computer program product of claim 13, wherein the processor system is further caused to determine a set of grammatical rules that define a valid expression syntax for the symbolic expression, wherein the symbolic expression follows the set of grammatical rules.

15. The computer program product of claim 13, wherein the symbolic expression being responsive to the identified one or more relevant explanatory variables corresponds to a symbolic expression whose derivative with respect to the identified one or more relevant explanatory variables is a non-zero expression.

16. The computer program product of claim 15, wherein the processor system is further caused to determine the derivative of the symbolic expression with respect to the identified one or more relevant explanatory variables, wherein the determining the derivative comprises expressing sub-expressions of the symbolic expression within an expression tree and determining partial derivatives of the sub-expressions with respect to the identified one or more relevant explanatory variables.

17. The computer program product of claim 16, wherein the generating the output data that corresponds to the symbolic expression comprises determining reciprocals or eigenvalues of the partial derivatives, and the determined reciprocals or the eigenvalues are bounded expressions.

18. A computer-implemented method comprising:

receiving, by a symbolic expression discovery engine implemented with a machine learning system, a set of data, wherein the set of data comprises data of at least one explanatory variable and data of at least one response variable;

receiving, by the symbolic expression discovery engine, an input that identifies one or more relevant explanatory variables;

determining, using the machine learning system, a symbolic expression that represents the received set of data and includes the identified one or more relevant explanatory variables such that the controller learns a relationship between the at least one explanatory variable and the at least one response variable; and generating, by the symbolic expression discovery engine, an output data that corresponds to a symbolic expression that represents the relationship between the at least one explanatory variable and the at least one response variable, wherein the symbolic expression is responsive to the identified one or more relevant explanatory variables, and the symbolic expression comprises a mathematically stable expression, the stable expression defined by the output data of the symbolic expression and a value of each internal state of the symbolic expression being limited within bounds, wherein the symbolic expression corresponds to an expression of minimal complexity, and wherein the output data that is based on the symbolic expression having the minimal complexity does not deviate from the received data of the response variables beyond a threshold.

19. The computer-implemented method of claim 18, wherein the symbolic expression being responsive to the identified one or more relevant explanatory variables corresponds to a symbolic expression whose derivative with respect to the identified one or more relevant explanatory variables is a non-zero expression.

20. A symbolic expression discovery engine system comprising:
a plurality of interconnected processor elements defining a machine learning system, wherein connections between the processor elements are configured with numerical weights that correspond to a strength or weakness of a given connection, and the plurality of interconnected processor elements being configured to perform a method comprising:
receiving a set of data, wherein the set of data comprises data of at least one explanatory variable and data of at least one response variable;
receiving an input that identifies one or more relevant explanatory variables;
determining, using the machine learning system, a symbolic expression that represents the received set of data and includes the identified one or more relevant explanatory variables such that the machine learning system learns a relationship between the at least one explanatory variable and the at least one response variable; and
generating an output data that corresponds to a symbolic expression that represents the relationship between the at least one explanatory variable and the at least one response variable, wherein the symbolic expression is responsive to the identified one or more relevant explanatory variables, and the symbolic expression comprises a mathematically stable expression, the stable expression defined by the output data of the symbolic expression and a value of each internal state of the symbolic expression being limited within bound,
wherein the symbolic expression corresponds to an expression of minimal complexity, and
wherein the output data that is based on the symbolic expression having the minimal complexity does not deviate from the received data of the response variables beyond a threshold.

21. The symbolic expression discovery engine system of claim 20, wherein the symbolic expression being responsive to the identified one or more relevant explanatory variables corresponds to a symbolic expression whose derivative with respect to the identified one or more relevant explanatory variables is a non-zero expression.

* * * * *